(12) United States Patent
Seo et al.

(10) Patent No.: US 8,891,316 B2
(45) Date of Patent: Nov. 18, 2014

(54) NONVOLATILE MEMORY DEVICES INCLUDING NOTCHED WORD LINES

(75) Inventors: Boyoung Seo, Suwon-si (KR); Yongkyu Lee, Gwacheon-si (KR); Hyucksoo Yang, Seoul (KR); Yongtae Kim, Yongin-si (KR); Byungsup Shim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 264 days.

(21) Appl. No.: 13/428,965

(22) Filed: Mar. 23, 2012

(65) Prior Publication Data

US 2012/0243339 A1   Sep. 27, 2012

(30) Foreign Application Priority Data

Mar. 24, 2011  (KR) .......................... 10-2011-0026567

(51) Int. Cl.
*G11C 16/04* (2006.01)
*H01L 29/423* (2006.01)
*H01L 29/788* (2006.01)
*H01L 27/115* (2006.01)
*H01L 21/28* (2006.01)

(52) U.S. Cl.
CPC ...... *G11C 16/0425* (2013.01); *H01L 29/42328* (2013.01); *H01L 29/7881* (2013.01); *H01L 27/11546* (2013.01); *H01L 21/28273* (2013.01)
USPC ............. 365/185.29; 365/185.08; 365/185.18

(58) Field of Classification Search
CPC ........... G11C 16/0416; G11C 16/0483; G11C 16/12; G11C 16/3445; G11C 16/3466; G11C 16/0425; H01L 21/28273; H01L 27/11546; H01L 29/4238; H01L 29/7881

USPC ........................... 365/185.29, 185.08, 185.18
See application file for complete search history.

(56) References Cited

U.S. PATENT DOCUMENTS

| | | | | |
|---|---|---|---|---|
| 6,130,838 | A * | 10/2000 | Kim et al. | 365/185.17 |
| 6,256,228 | B1 * | 7/2001 | Hirano | 365/185.11 |
| 6,545,915 | B2 * | 4/2003 | Ohtani et al. | 365/185.29 |
| 6,703,662 | B1 | 3/2004 | Koishikawa | |
| 6,757,196 | B1 * | 6/2004 | Tsao et al. | 365/185.17 |
| 7,924,630 | B2 * | 4/2011 | Carman | 365/189.04 |

(Continued)

FOREIGN PATENT DOCUMENTS

| | | |
|---|---|---|
| JP | 2001-176990 | 6/2001 |
| JP | 2008-004831 | 1/2008 |
| KR | 1019990057418 | 7/1999 |

OTHER PUBLICATIONS

Bomy Chen; *Highly Reliable SuperFlash Embedded Memory Scaling for Low Power SoC*, IEEE; 2 pages; (2007).

(Continued)

*Primary Examiner* — Pho M Luu
(74) *Attorney, Agent, or Firm* — Myers Bigel Sibley & Sajovec, P.A.

(57) ABSTRACT

Nonvolatile memory devices can include a floating gate on a substrate, with a first tunnel insulating film therebetween. A memory gate can be on the floating gate, with a blocking insulating film therebetween. A word line can be located at a first side of both the memory gate and the floating gate, with a second tunnel insulating film therebetween. The first side of the floating gate can protrude beyond the first side of the memory gate toward the word line.

20 Claims, 29 Drawing Sheets

(56) References Cited

U.S. PATENT DOCUMENTS

| | | | |
|---|---|---|---|
| 8,300,469 B2 * | 10/2012 | Lin et al. | 365/185.18 |
| 2009/0039410 A1 | 2/2009 | Liu et al. | |
| 2010/0054043 A1 | 3/2010 | Liu et al. | |

OTHER PUBLICATIONS

Jia et al; *Split-Gate Flash MLC with Self-limiting Programming*; IEEE; 2 pages; (2008).

* cited by examiner

NONVOLATILE MEMORY DEVICES INCLUDING NOTCHED WORD LINES

CROSS-REFERENCE TO RELATED APPLICATIONS

This U.S. non-provisional patent application claims priority under 35 U.S.C. §119 of Korean Patent Application No. 10-2011-0026567, filed on Mar. 24, 2011, the entire content of which is incorporated herein by reference.

BACKGROUND

The present inventive concept herein relates to nonvolatile memory devices and methods of manufacturing the same.

Semiconductor memory devices may be classified into random access memories (RAM) and read only memory (ROM). RAMs are volatile memory devices that may lose their stored data when their power supplies are interrupted, whereas ROMs are nonvolatile memory devices that may maintain their stored data even when their power supplies are interrupted. The nonvolatile memory devices may include a programmable ROM (PROM), an erasable PROM (EPROM), an electrically EPROM (EEPROM), a flash memory device, etc.

SUMMARY

Embodiments of the inventive concept can provide a nonvolatile memory device that includes a floating gate on a substrate, with a first tunnel insulating film therebetween. A memory gate can be on the floating gate, with a blocking insulating film therebetween. A word line can be located at a first side of both the memory gate and the floating gate, with a second tunnel insulating film therebetween. The first side of the floating gate can protrude beyond the first side of the memory gate toward the word line.

In some embodiments according to the inventive concept, a split-gate nonvolatile memory device can include a floating gate that is on a substrate separated by a first tunnel insulating film. A memory gate can be on the floating gate and a word line can be disposed at a first side of both the memory gate and the floating gate, where a second tunnel insulating film is located therebetween. A notch can be included therein allowing the first side of the floating gate to be located closer to the word line than a closest portion of the first side of the memory gate.

In some embodiments according to the inventive concept, the word line and the memory gate are configured to receive voltages that are about equal to one another during a read operation to the split-gate nonvolatile memory device. In some embodiments according to the inventive concept, the word line is configured to receive a first voltage and the memory gate is configured to receive a second voltage that is greater than the first voltage and is sufficient to cause tunneling of charge from the substrate to the floating gate during a program operation to the split-gate nonvolatile memory device.

In some embodiments according to the inventive concept, a metal silicide source line can be included on the substrate at a second side of both the memory gate and the floating gate, opposite the first side, wherein the metal silicide source line is configured to receive a third voltage that is greater than the first voltage and less than the second voltage during the program operation.

In some embodiments according to the inventive concept, the word line is configured to receive a first voltage and the memory gate is configured to receive a negative voltage that is sufficient to cause tunneling of charge from the floating gate to the word line through the second tunnel insulating film inside the notch during an erasure operation to the split-gate nonvolatile memory device.

In some embodiments according to the inventive concept, a dedicated erasure gate is absent from the split-gate nonvolatile memory device.

In some embodiments according to the inventive concept, a second side of the floating gate, opposite the first side, protrudes beyond a second side of the memory gate, opposite the first side so that the floating gate extends beyond both the side and second sides of the memory gate. In some embodiments according to the inventive concept, a distance from an outer surface of the second tunnel insulating film to an inner surface of the second tunnel insulating film comprises about 100~140 Å.

In some embodiments according to the inventive concept, a method of forming a split-gate nonvolatile memory device can include forming a first tunnel insulating film on a substrate. A floating gate can be formed on the first tunnel insulating film and a memory gate can be formed on the floating gate. A second tunnel insulating film can be formed over the first tunnel insulating film, the floating gate, and the memory gate and a word line can be formed on the second tunnel insulating film at a first side of both the memory gate and the floating gate, including a notch therein at the substrate allowing the first side of the floating gate to be located closer to the word line than a closest portion of the first side of the memory gate to the word line.

DESCRIPTION OF EMBODIMENTS ACCORDING TO THE INVENTIVE CONCEPT

Figure 1:
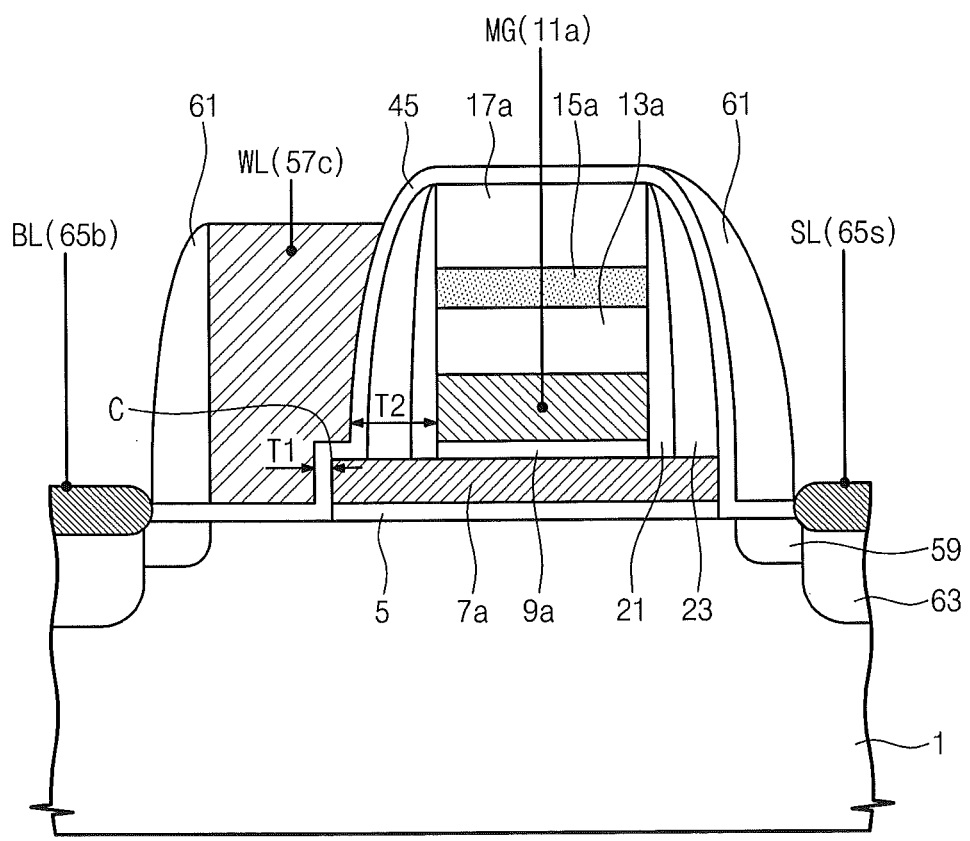
FIG. 1 is a cross sectional view illustrating a unit memory cell of a nonvolatile memory device in accordance with embodiments of the inventive concept.

The present inventive concept now will be described more fully hereinafter with reference to the accompanying drawings, in which embodiments of the inventive concept are shown. However, this inventive concept should not be construed as limited to the embodiments set forth herein. Rather, these embodiments are provided so that this disclosure will be thorough and complete, and will fully convey the scope of the inventive concept to those skilled in the art. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises," "comprising," "having," "having," "includes," and/or "including" when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (or variations thereof), it can be directly on or extend directly onto the other element or intervening elements may also be present. In contrast, when an element is referred to as being "directly on" or extending "directly onto" another element (or variations thereof), there are no intervening elements present. It will also be understood that when an element is referred to as being "connected" or "coupled" to another element (or variations thereof), it can be directly connected or coupled to the other element or intervening elements may be present. In contrast, when an element is referred to as being "directly connected" or "directly coupled" to another element (or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present inventive concept.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the FIG. 1 is turned over, elements described as being on the "backside" of substrate would then be oriented on "upper" surface of the substrate. The exemplary term "upper", can therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below.

Embodiments of the present inventive concept are described herein with reference to cross section and perspective illustrations that are schematic illustrations of idealized embodiments of the present inventive concept. As such, variations from the shapes of the illustrations as a result, for example, of manufacturing techniques and/or tolerances, are to be expected. Thus, embodiments of the present inventive concept should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Nonvolatile memory devices in accordance with some embodiments of the inventive concept may have a split gate type structure.

FIG. 1 is a cross sectional view illustrating a unit memory cell of a nonvolatile memory device in accordance with an embodiment of the inventive concept.

Referring to FIG. 1, a nonvolatile memory device in accordance with the inventive concept may include a floating gate 7a disposed on a substrate 1 by interposing a first tunnel insulating film 5 between the floating gate 7a and the substrate 1. A memory gate 11a is disposed on the floating gate 7a by interposing a blocking insulating film pattern 9a between the floating gate 7a and the memory gate 11a. A word line 57c is disposed at one side of the memory gate 11a and the floating gate 7a by interposing a second tunnel insulating film 45 between the word line 57c and the memory gate 11a and between the word line 57c and the floating gate 7a. The second tunnel insulating film 45 extends to be interposed between a lower surface of the word line 57c and an upper surface of the substrate 1.

The width of the floating gate 7a is greater than the width of the memory gate 11a, so the floating gate 7a protrudes beyond both sidewalls of the memory gate 11a. A first capping film pattern 13a, a second capping film pattern 15a and a third capping film pattern 17a are sequentially stacked on the memory gate 11a and are arranged with a sidewall of the memory gate 11a. A top surface of the word line 57c may be lower than a top surface of the third capping film pattern 17a and may be higher than a top surface of the second capping film pattern 15a.

Sidewalls of the third capping film pattern 17a, the first capping film pattern 13a, the second capping film pattern 15a, the memory gate 11a and the blocking insulating film pattern 9a are covered with a first sidewall spacer 21 and a second sidewall spacer 23. Part of a top surface of the floating gate 7a between the word line 57c and the memory gate 11a, is exposed without being covered by the first sidewall spacer 21 and the second sidewall spacer 23. The second tunnel insulating film 45 may cover an outer sidewall of the second sidewall spacer 23, a top surface of the third capping film pattern 17a, a part of the top surface of the floating gate 7a and both sidewalls of the floating gate 7a and the first tunnel insulating film 5. One sidewall of the floating gate 7a protrudes beyond the sidewall of the memory gate 11a toward the word line 57c. A distance T1 between the word line 57c and the floating gate 7a is smaller than a distance T2 between the word line 57c and the memory gate 11a. The distance T1 may correspond to a thickness of the second tunnel insulating film 45. The second distance T2 may correspond to the sum of thicknesses of the first sidewall spacer 21, the second sidewall spacer 23 and the second tunnel insulating film 45. One sidewall and a part of top surface of the floating gate 7a adjacent to the word line 57c form a corner C and contact the second tunnel insulating film 45.

A sidewall of the word line 57c and a sidewall of the second tunnel insulating film 45 covering a sidewall of the second sidewall spacer 23 spaced apart from the word line 57c are covered with a third sidewall spacer 61. A low concentration impurity injection region 59 may be formed in the substrate 1 under the third sidewall spacer 61. A high concentration impurity injection region 63 is formed in the substrate 1 adjacent to and aligned with the third sidewall spacer 61. A metal silicide film (65b, 65s) is disposed on the substrate on the high concentration impurity injection region 63. The metal silicide film (65b, 65s) may include a first silicide film (BL, 65b) adjacent to the word line 57c and a second silicide film (SL, 65s) spaced apart from the word line 57c. The first silicide film (BL, 65b) may correspond to a bit line BL. The second silicide film (SL, 65s) may correspond to a source line SL. The metal silicide (65b, 65s) is disposed to reduce a resistance of the bit line BL and the source line SL, thereby improving a signal propagation velocity.

Figure 2:
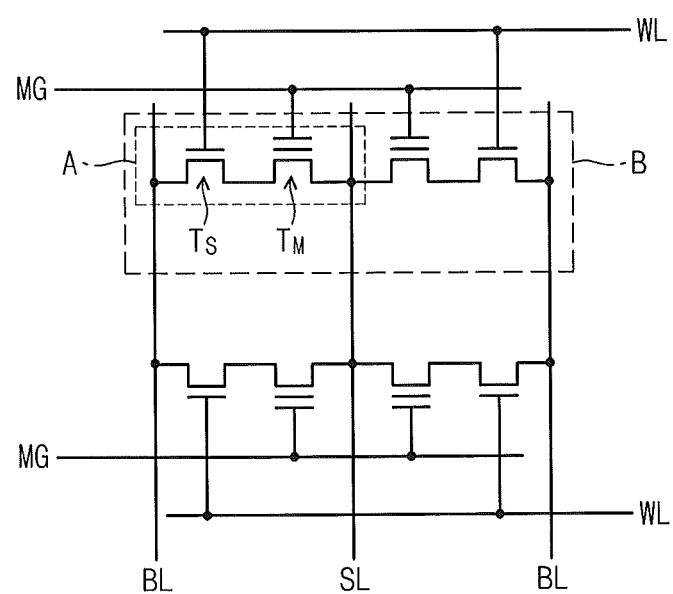
FIG. 2 is an equivalent circuit diagram of a nonvolatile memory device in accordance with embodiments of the inventive concept.

The nonvolatile memory device of FIG. 1 may have an equivalent circuit diagram of FIG. 2.

FIG. 2 is an equivalent circuit diagram of a nonvolatile memory device in accordance with an embodiment of the inventive concept.

Referring to FIGS. 1 and 2, a nonvolatile memory device in accordance with the inventive concept may include a plurality of unit memory cells A. The plurality of unit memory cells A may be disposed in a cell array region CAR. Each of the unit memory cells A may include one selection transistor Ts and one memory transistor $T_M$. A gate electrode of the selection transistor Ts may be coupled to the word line 57c. The memory transistor $T_M$ may include the floating gate 7a and the memory gate line MG. Adjacent two unit memory cells A may be symmetrically arranged to share one source line SL. The memory device of FIG. 1 illustrates a cross section of one unit memory cell A. In a nonvolatile memory device in accordance with the inventive concept, when the device operates, a voltage may be applied like a table 1 below.

TABLE 1

|  |  | Applied voltage (V) when a read operation is performed | Applied voltage (V) when a program operation is performed | Applied voltage (V) when an erasure operation is performed |
|---|---|---|---|---|
| selected | WL | 1.8 | 1.0 | 1.8 |
|  | MG | 1.8 | 10.5 | −12 |
|  | SL | 0 | 4.5 | 0 |
|  | BL | 0.6 | 0.2 | 0 |
| unselected | WL | 0 | 0 | 0 |
|  | MG | 0 | 0 | 0 |
|  | SL | 0 | 0 | 0 |
|  | BL | 0 | 0 | 0 |

Figure 3A:
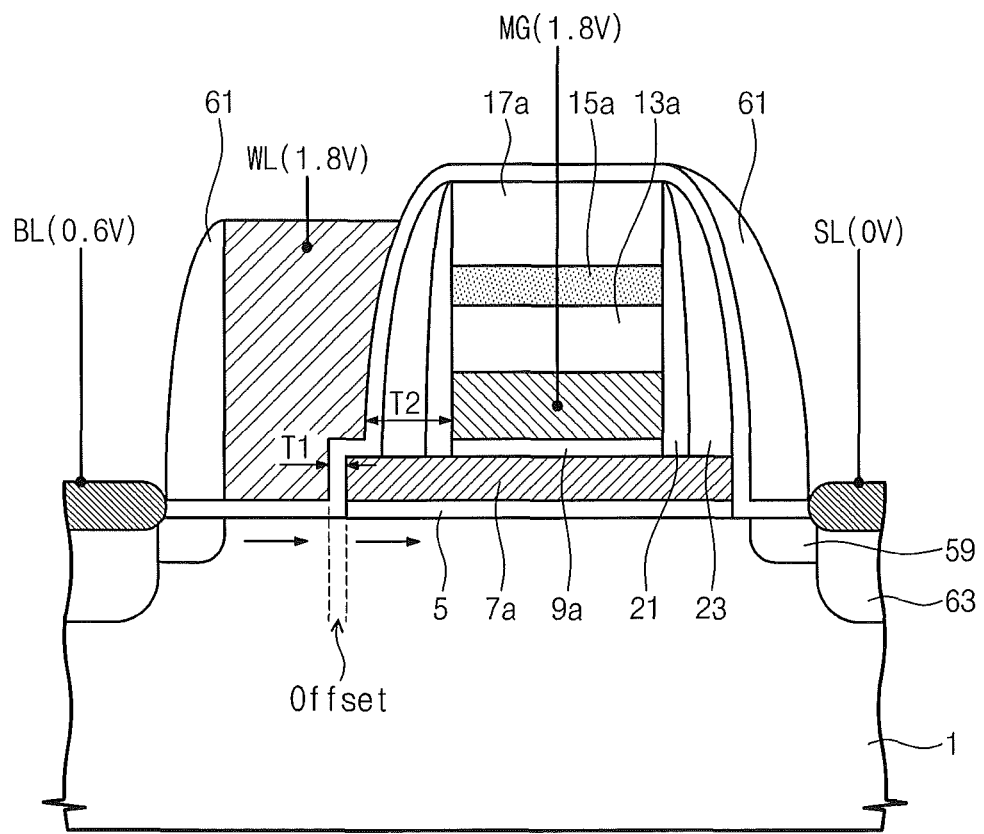
FIG. 3A illustrates the movement of charges when a read operation is performed on a unit memory cell of a nonvolatile memory device in accordance with an embodiment of the inventive concept.

FIG. 3A represents the movement of charges when a read operation is performed on a unit memory cell of a nonvolatile memory device in accordance with an embodiment of the inventive concept.

Referring to FIG. 3A and the table 1, a voltage, for example, 1.8V that can form a channel in the substrate 1 under the word line WL is applied to a selected word line WL. 1.8V, 0.6V and 0V are applied to the memory gate line MG, the bit line BL and the source line SL respectively. Under these conditions, charge can flow as shown by the arrows in FIG. 3A. Since the distance T1 between the word line 57c and the floating gate 7a is smaller than a distance T2 between the word line 57c and the memory gate 11a, an offset section between the word line 57c and the floating gate 7a becomes relatively short. Thus, charges may more readily move to the offset section and thereby a channel may be more easily formed under the floating gate 7a. This is also advantageous to improvement of a breakdown voltage characteristic of the memory gate 11a. A channel can be formed under the floating gate 7a depending on whether or not charges are stored in the floating gate 7a. Whether the unit memory cell is programmed or not may be recognized by sensing whether the channel is formed under the floating gate 7a or not. 0V may be applied to a word line, a memory gate line, a source line and a bit line of unselected unit memory cell.

Figure 3B:
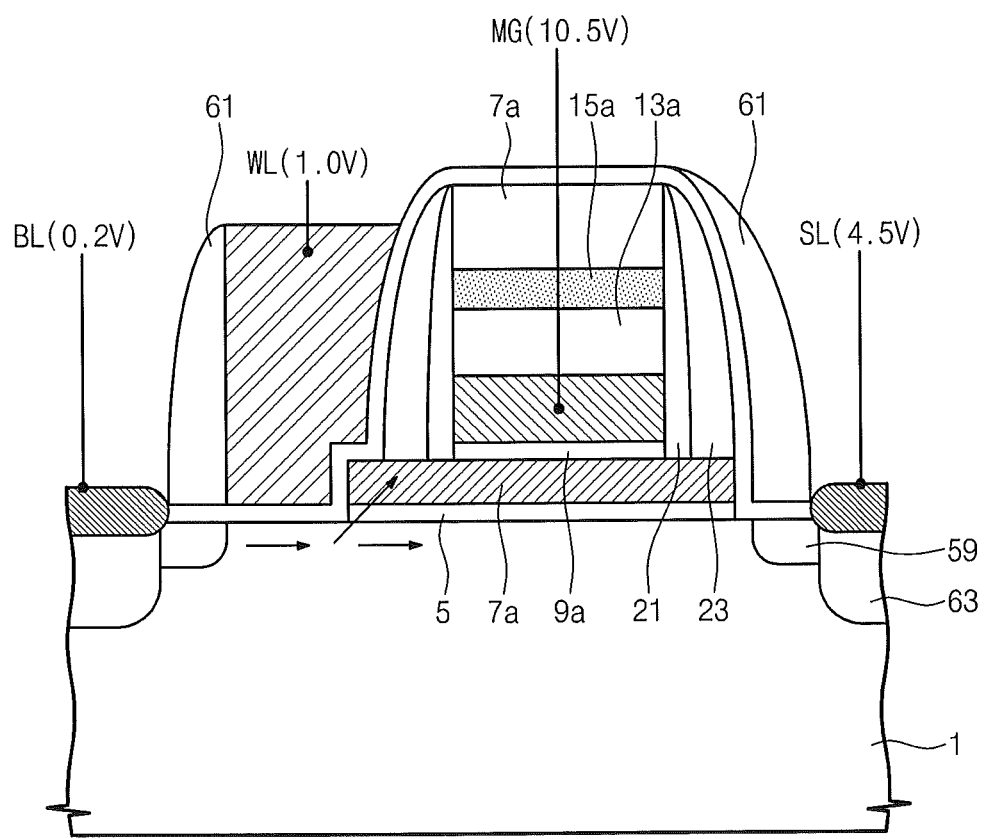
FIG. 3B represents the movement of charges when a program (write) operation is performed on a unit memory cell of a nonvolatile memory device in accordance with embodiments of the inventive concept.

FIG. 3B represents the movement of charges when a program (write) operation is performed on a unit memory cell of a nonvolatile memory device in accordance with an embodiment of the inventive concept.

Referring to FIG. 3B and the table 1, a voltage, for example, 1.0V that can form a channel in the substrate 1 under the word line WL is applied to a selected word line WL. A voltage, for example, 10.5V that can attract charge toward the floating gate 7a is applied to the memory gate line MG. 0.2V and 4.5V are applied to the bit line BL and the source line SL respectively. Under these conditions, charge can flow as shown by the arrows in FIG. 3B into the floating gate 7a by the theory of Fowler Nordheim FN tunneling while moving from the substrate 1 under the word line WL to the substrate 1 under the floating gate 7a. 0V may be applied to a word line, a memory gate line, a source line and a bit line of unselected unit cell.

Figure 3C:
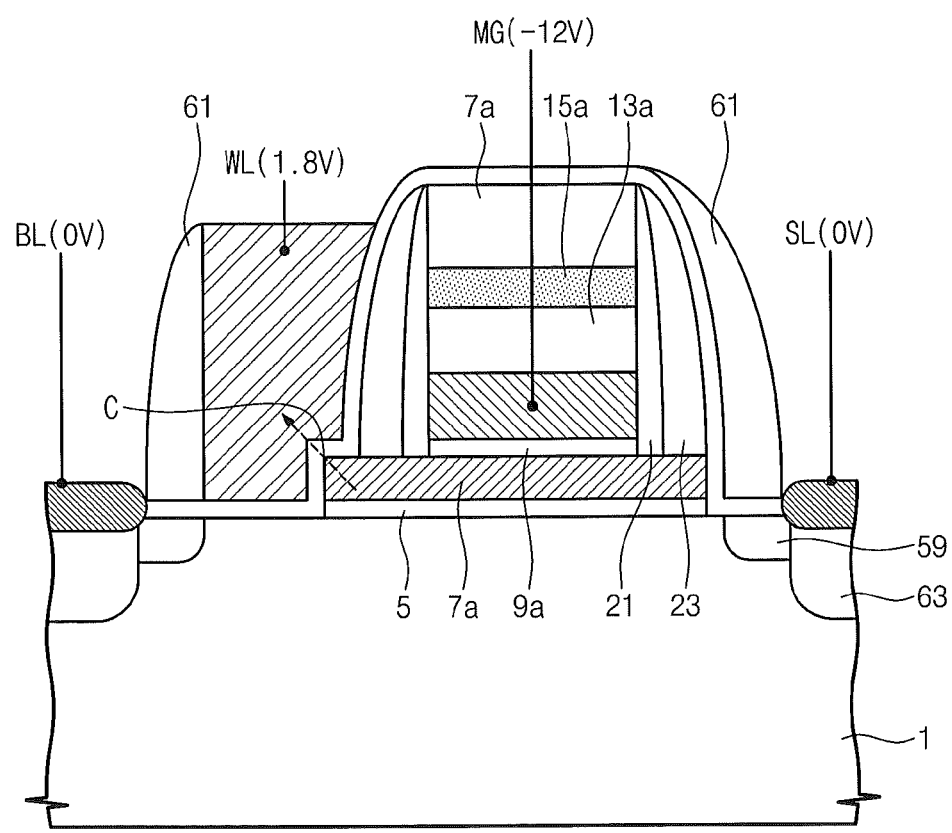
FIG. 3C represents the movement of charges when an erasure operation is performed on a unit memory cell of a nonvolatile memory device in accordance with embodiments of the inventive concept.

FIG. 3C represents the movement of charges when an erasure operation is performed on a unit memory cell of a nonvolatile memory device in accordance with an embodiment of the inventive concept.

Referring to FIG. 3C and the table 1, a voltage, for example, 1.8V that can attract charges stored in the floating gate 7a is applied to the selected word line WL and a voltage, for example, −12V that can push charges stored in the floating gate 7a, is applied to the memory gate line MG. 0V is applied to the bit line BL and the source line SL. Under these conditions, charge can flow as shown in FIG. 3C from the floating gate 7a through a corner C of the floating gate 7a to the word line WL. When an erasure operation is performed, an electric field can be concentrated at the corner C and thereby charges may easily move from the floating gate 7a toward the word line WL. Also, when an erasure operation is performed, a voltage being applied to the word line WL may be reduced by applying a negative voltage to the memory gate line MG. As a result of this, thicknesses of the second tunnel insulating film 45 and the first tunnel insulating film 5 may be reduced. This may lower a read voltage being applied to the word line WL and may improve performance of the word line WL. Since in a nonvolatile memory device of the inventive concept, an erasure operation is performed through the word line WL without including an erasure gate, the complexity of the design and the manufacturing process may be reduced. The nonvolatile memory device may have an advantage such that an erasure operation may be performed by unit memory cell by performing an erasure operation by one word line WL.

Figure 4:
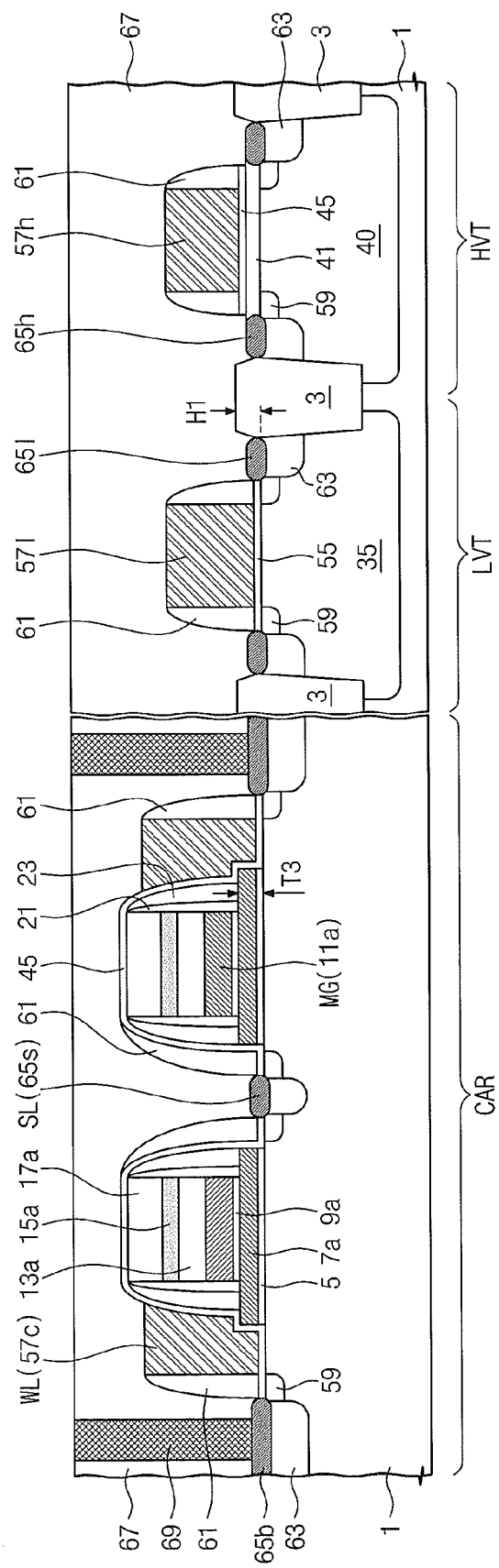
FIG. 4 is a cross sectional view of a nonvolatile memory device including a peripheral circuit region and a cell array region according to embodiments of the inventive concept.

FIG. 4 is a cross sectional view of a nonvolatile memory device including a peripheral circuit region and a cell array region according to an embodiment of the inventive concept.

Referring to FIG. 4, a nonvolatile memory device in accordance with an embodiment of the inventive concept includes a cell array region (CAR) and a peripheral circuit region (LVT, HVT). The peripheral circuit region (LVT, HVT) includes a low voltage transistor region LVT and a high voltage transistor region HVT. The low voltage transistor region LVT and the high voltage transistor region HVT are separated by a device isolation film 3 formed in the substrate 1. In the cell array region CAR, a cross section of the two adjacent unit memory cells B in the equivalent circuit of FIG. 2 is illustrated. That is, the unit memory cells of FIG. 1 are symmetrically disposed while sharing one source line SL. Cross sections of a low voltage transistor and a high voltage transistor are illustrated in the low voltage transistor region LVT and the high voltage transistor region HVT respectively. A low voltage gate electrode 57l and a low voltage metal silicide film 65l may be disposed in the low voltage transistor region LVT. A high voltage gate electrode 57h and a high voltage metal silicide film 65h may be disposed in the high voltage transistor region HVT. The substrates 1 of the cell array region CAR and the peripheral circuit region (LVT, HVT) are covered with an interlayer insulating film 67. Contact plugs 69 pass through the interlayer insulating film 67 to connect to the bit lines BL.

FIGS. 5 through 27 are cross sectional views illustrating a process of forming a nonvolatile memory device having a cross section of FIG. 4.

Figure 5:
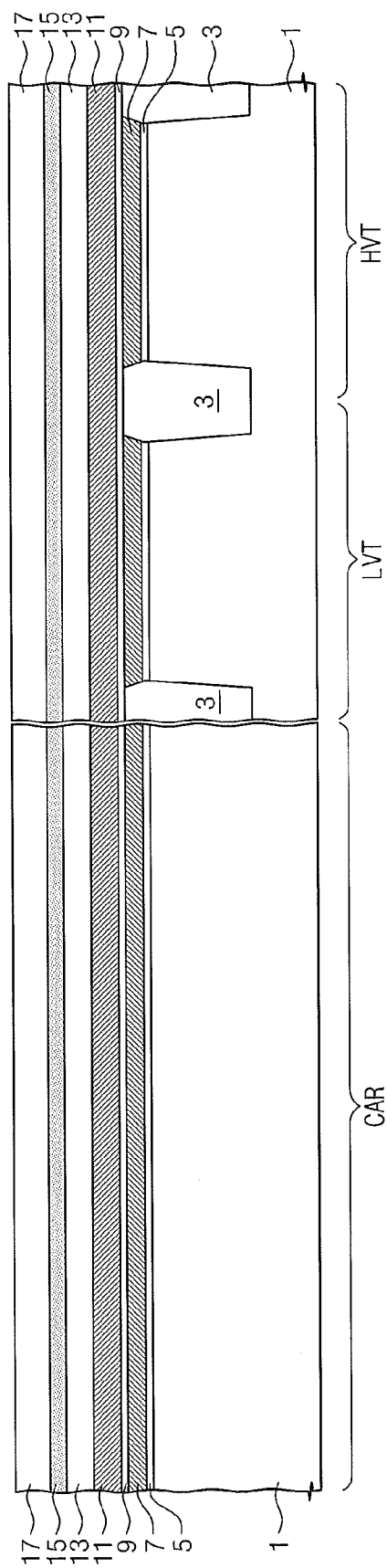
FIGS. 5 through 27 are cross sectional views illustrating methods of forming nonvolatile memory devices having a cross section of FIG. 4 in some embodiments according to the inventive concept.

Referring to FIG. 5, a device isolation film 3 is formed in a substrate 1 including a cell array region CAR and a peripheral circuit region (LVT, HVT) to separate the cell array region CAR and the peripheral circuit region (LVT, HVT) from each other. The device isolation film 3 may be formed by a shallow trench isolation (STI) method. An upper portion of the device isolation film 3 may be formed to protrude from the substrate 1. A height H1 of the protrusion of the device isolation film 3 may be equal to the sum T3 of thicknesses of first tunnel insulating film 5 and floating gate 7a that will be formed in a subsequent process (see FIG. 4).

In the cell array region CAR, the device isolation film 3 may have a plurality of line shapes crossing the substrate 1. A first tunnel insulating film 5 is formed on an entire surface of the substrate 1. The first tunnel insulating film 5 may be formed by performing a thermal oxidation process on the surface of the substrate 1. A floating gate film 7 is formed on an entire surface of the substrate 1 including the first tunnel insulating film 5, and then a planarization process is performed on the substrate 1 including the floating gate film 7 and the first tunnel insulating film 5 to expose a top surface of the device isolation film 3. In the cell array region CAR, the floating gate film 7 may be formed to have a plurality of line shapes disposed between the device isolation films 3.

A blocking insulating film 9, a memory gate film 11, a first capping film 13, a second capping film 15 and a third capping film 17 are formed on an entire surface of the substrate 1. The floating gate film 7 and the memory gate film 11 may be at least one of a polysilicon film, a metal film and a metal silicide film. The first capping film 13 and the third capping film 17 may be, for example, a silicon nitride film. The second capping film 15 may be, for example, a silicon oxide film having an etching selectivity with respect to the first and third capping films 13 and 17. The blocking insulating film 9 may be, for example, a triple film of an oxide film, a nitride film, and an oxide film.

Figure 6:
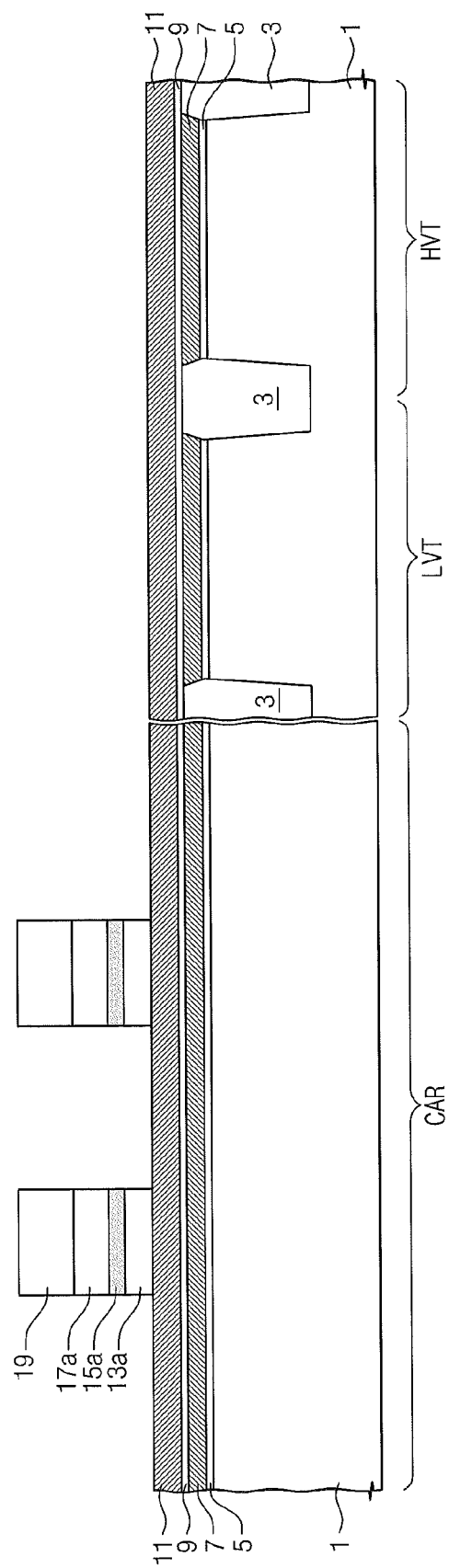

Referring to FIG. 6, in the cell array region CAR, a first photoresist pattern 19 is formed on the third capping film 17. The first photoresist pattern 19 may be formed using a photolithography process. The first photoresist pattern 19 may correspond to a memory gate line shape and may be formed along a direction crossing the floating gate film 7 of line shape. The first photoresist pattern 19 may not be formed in the peripheral circuit region (LVT, HVT). The third, second and first capping films 17, 15 and 13 are etched using the first photoresist pattern 19 as an etching mask to form third, second and first capping film patterns 17a, 15a and 13a.

Figure 7:
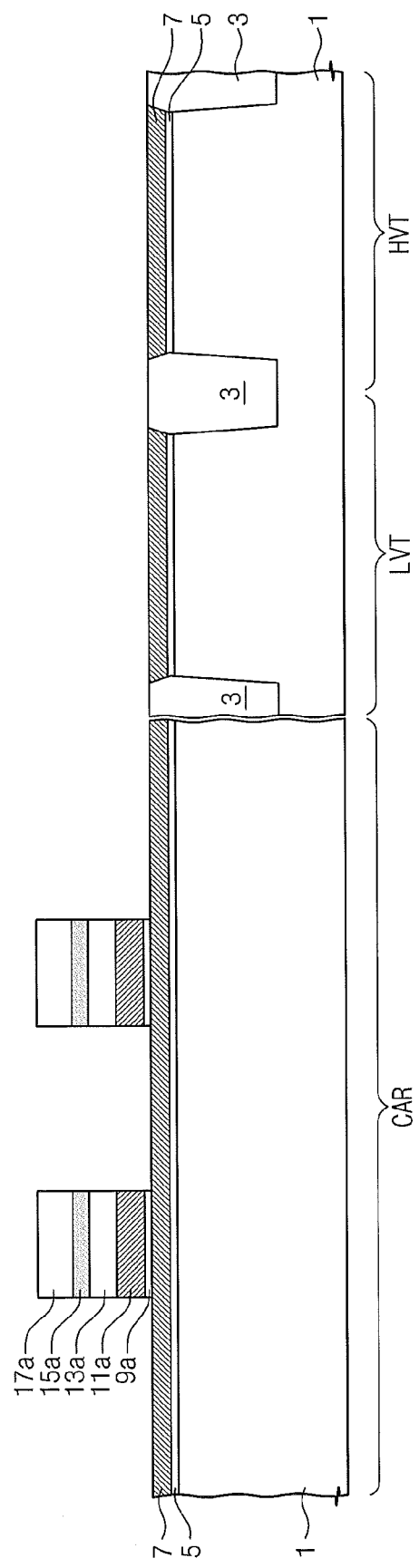

Referring to FIG. 7, the first photoresist pattern 19 is removed. The memory gate film 11 and the blocking insulating film 9 are etched using the third capping film pattern 17a to form a memory gate 11a and a blocking insulating film pattern 9a and expose the floating gate film 7. At this time, the memory gate film 11 and the blocking insulating film 9 of the peripheral circuit region (LVT, HVT) may also be removed.

Figure 8:
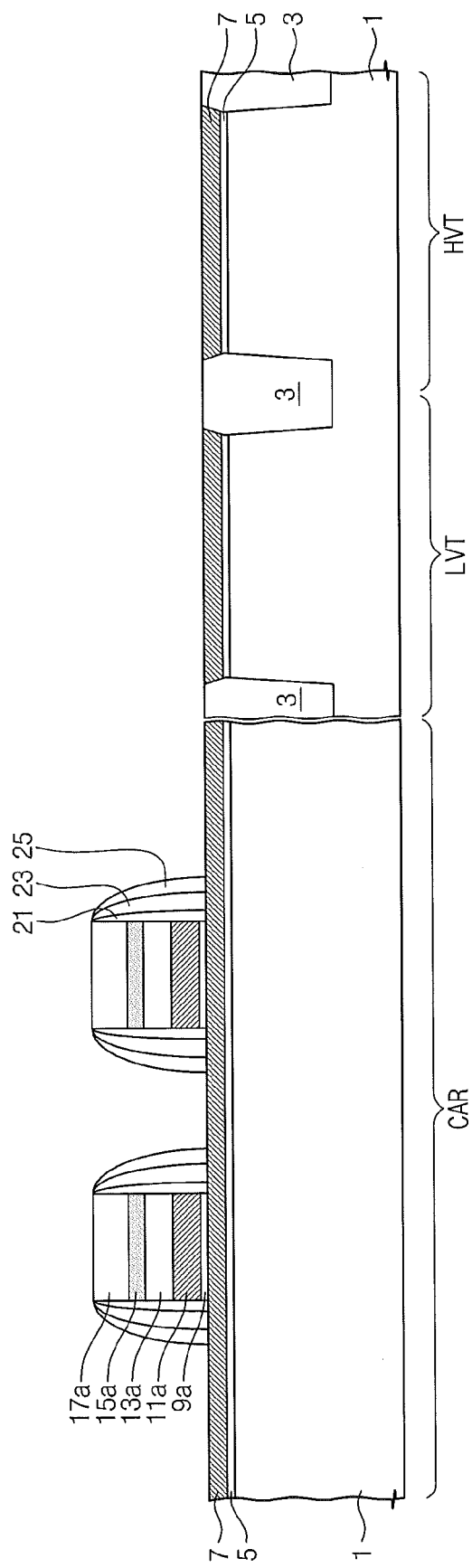

Referring to FIG. 8, a first sidewall spacer 21, a second sidewall spacer 23 and a first sacrificial spacer 25 covering sidewalls of the first through third capping film patterns 13a, 15a and 17a, the memory gate 11a and the blocking insulating film pattern 9a are formed. The first sidewall spacer 21 and the first sacrificial spacer 25 may be, for example, a silicon oxide film. The second sidewall spacer 23 may be, for example, a silicon nitride film having an etching selectivity with respect to the first sidewall spacer 21 and the first sacrificial spacer 25.

Figure 9:
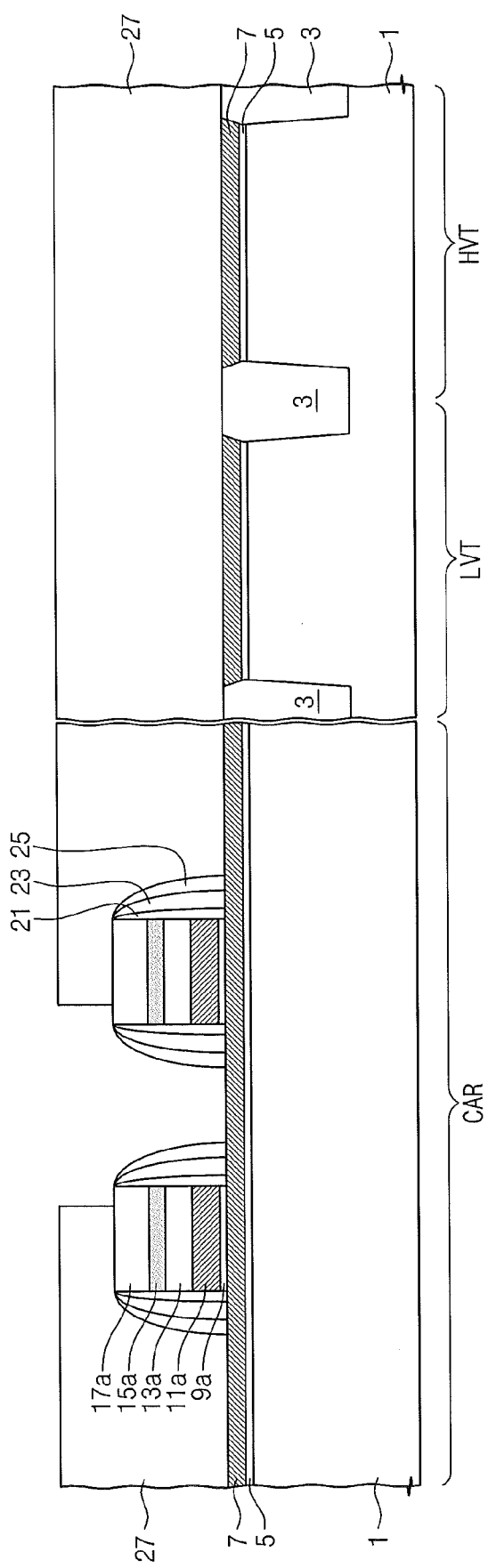

Referring to FIG. 9, a second photoresist pattern 27 is formed. The second photoresist pattern 27 covers the peripheral circuit region (LVT, HVT) and exposes the floating gate film 7, the first sidewall spacer 21, the second sidewall spacer 23 and the first sacrificial spacer 25 disposed between the adjacent two memory gates 11a in the cell array region CAR. The first sacrificial spacer 25 exposed by the second photoresist pattern 27 is removed. If the first sacrificial spacer 25 is formed of a silicon oxide film, it may be removed by an etching solution including hydrofluoric acid. If the third capping film pattern 17a and the second sidewall spacer 23 are formed of a silicon nitride film, the third capping film pattern 17a and the second sidewall spacer 23 are not removed while the first sacrificial spacer 25 is removed. The first sacrificial spacer 25 covered with the second photoresist pattern 27 is not removed.

Figure 10:
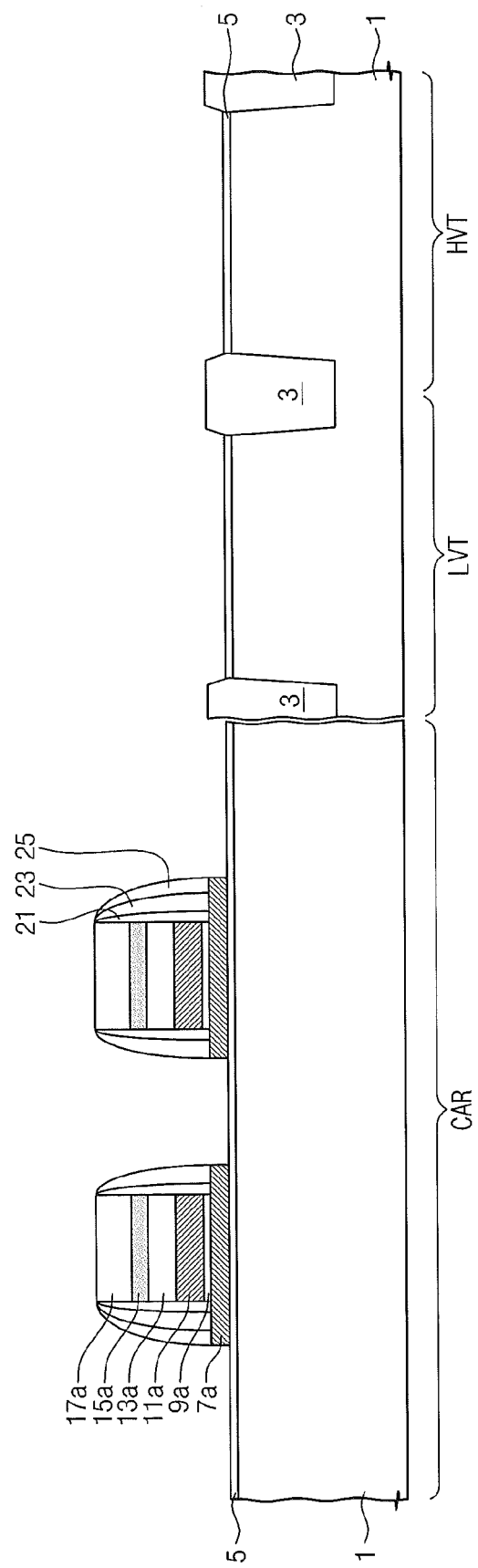

Referring to FIG. 10, the second photoresist pattern 27 is removed from an entire surface of the substrate 1. The floating gate film 7 is etched using the third capping film pattern 17a, the second sidewall spacer 23 and the remaining first sacrificial spacer 25 as an etching mask to a floating gate 7a in the cell array region CAR. The floating gate film 7 in the peripheral circuit region (LVT, HVT) is removed to expose the first tunnel insulating film 5.

Figure 11:
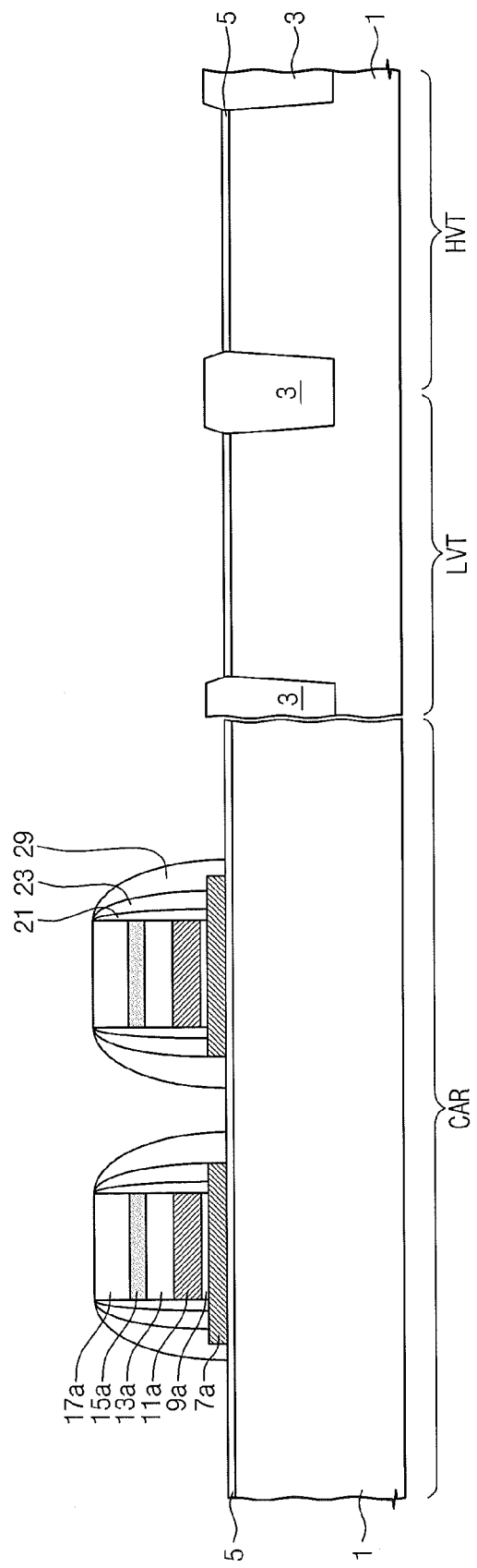

Referring to FIG. 11, the first sacrificial spacer 25 is removed. As a result, a sidewall and a part of top surface of the floating gate 7a is exposed. In the cell array region CAR, a second sacrificial spacer 29 covering the second sidewall spacer 23 and the sidewall of the floating gate 7a, including an upper corner, is formed. The second sacrificial spacer 29 may not be formed in the peripheral circuit region (LVT, HVT). The second sacrificial spacer 29 may be, for example, a silicon oxide film.

Figure 12:
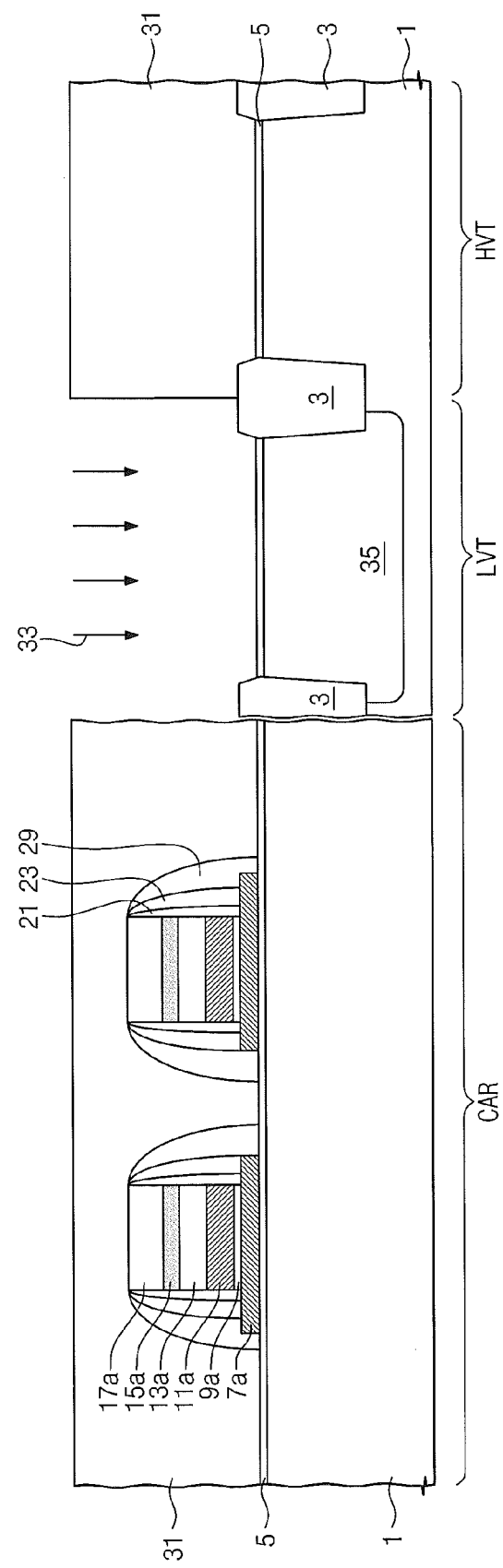

Referring to FIG. 12, a third photoresist pattern 31 is formed on the substrate 1. The third photoresist pattern 31 covers the cell array region CAR and the high voltage transistor region HVT but exposes the low voltage transistor region LVT. Impurity ions 33 are implanted into the substrate 1 using the third photoresist pattern 31 as an ion implanting mask to form a low voltage well region 35.

Figure 13:
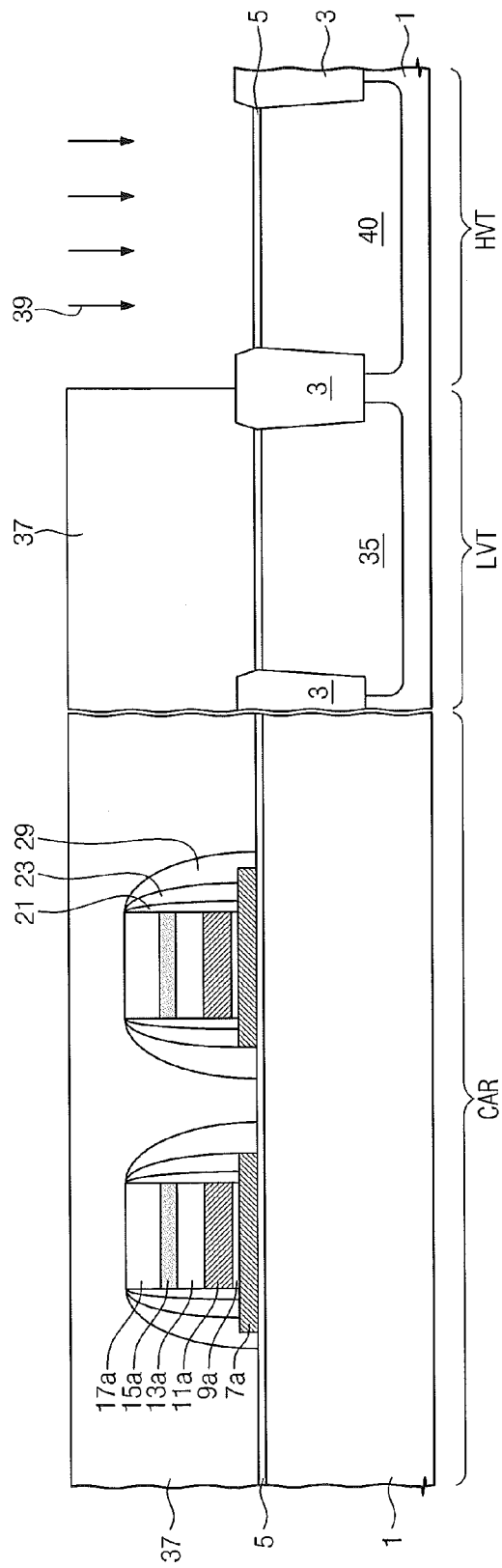

Referring to FIG. 13, the third photoresist pattern 31 is removed. A fourth photoresist pattern 37 is formed on the substrate 1. The fourth photoresist pattern 37 covers the cell array region CAR and the low voltage transistor region LVT but exposes the high voltage transistor region HVT. Impurity ions 39 are implanted into the substrate 1 using the fourth photoresist pattern 37 as an ion implanting mask to form a high voltage well region 40. The third sacrificial spacer 29 may perform a function of preventing damage of the memory gate 11a, the blocking insulating film pattern 9a, the floating gate 7a and the first tunnel insulating film 5 that may occur while the third and fourth photoresist patterns 31 and 37 are formed and removed.

Figure 14:
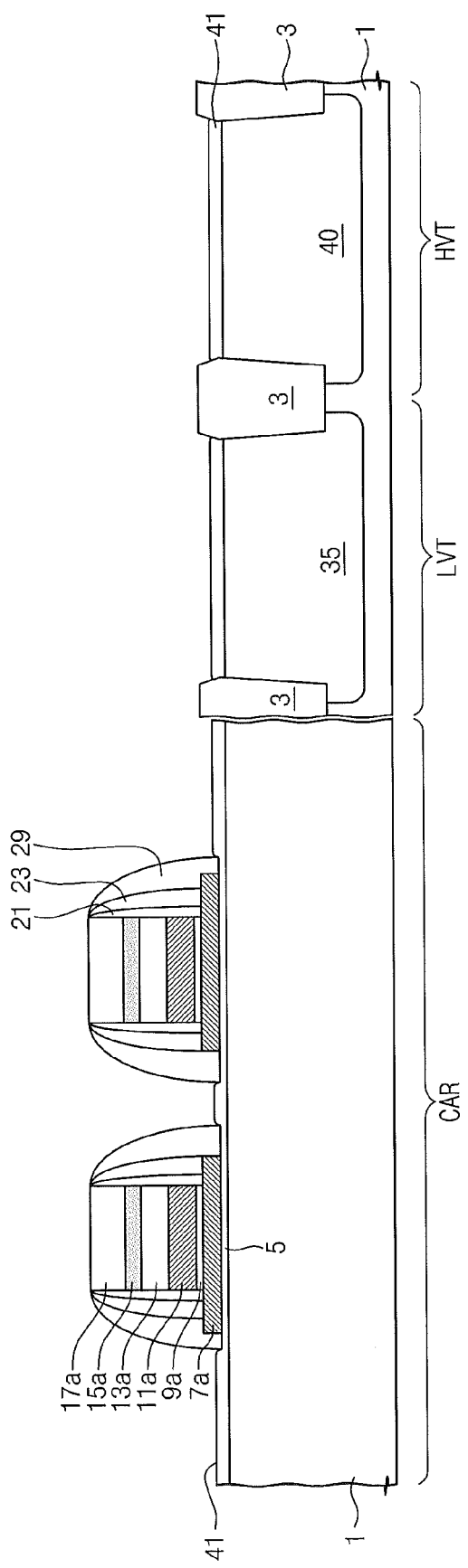

Referring to FIG. 14, the fourth photoresist pattern 37 is removed. At this time, the first tunnel insulating film 5 not covered with the second sacrificial spacer 29 is exposed. A thermal oxidation process and/or a deposition process are performed to form a high voltage gate insulating film 41 on the substrate 1. The exposed first tunnel insulating film 5 may become thick to form the high voltage gate insulating film 41.

Figure 15:
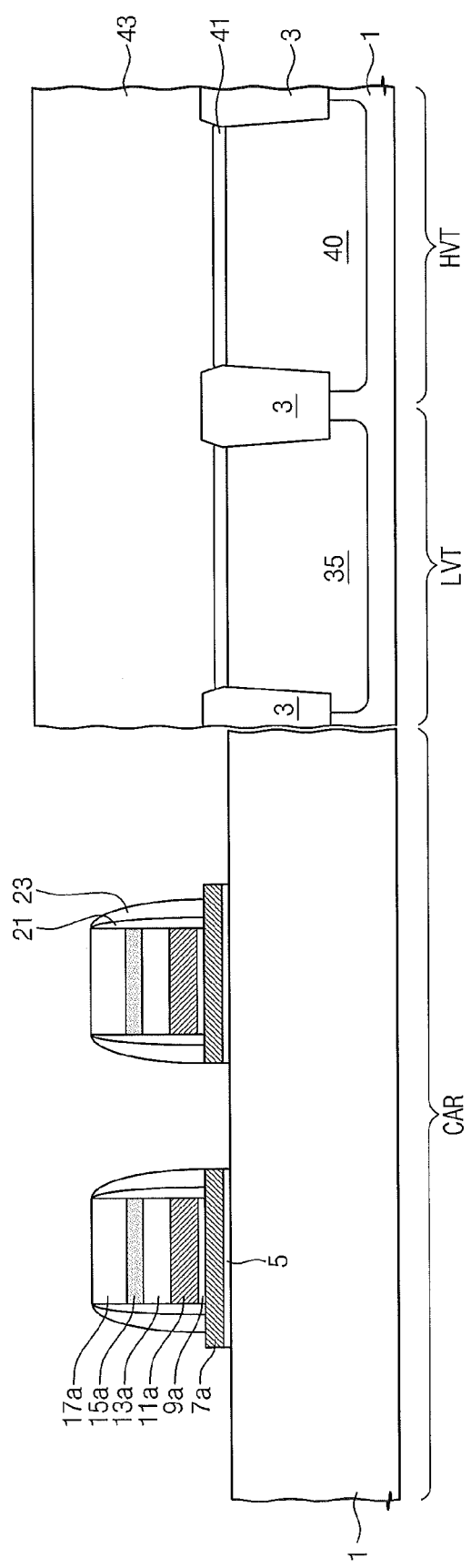

Referring to FIG. 15, a fifth photoresist pattern 43 is formed on the substrate 1. The third photoresist pattern 43 covers the peripheral circuit region (LVT, HVT) but exposes the cell array region CAR. The second sacrificial spacer 29 is removed in the cell array region CAR using the fifth photoresist pattern 43 as an etching mask. If the second sacrificial spacer 29 is a silicon oxide film, the high voltage gate insulating film 41 adjacent to the second sacrificial spacer 29 may be removed and thereby a surface of the substrate 1 in the cell array region CAR may be exposed.

Figure 16:
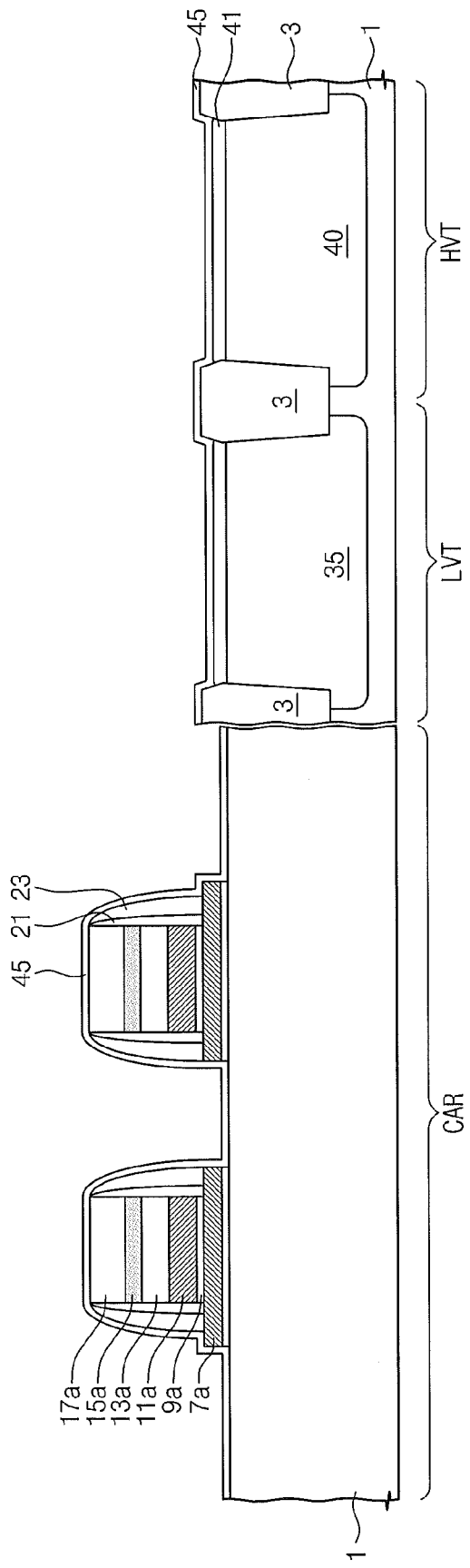

Referring to FIG. 16, the fifth photoresist pattern 43 is removed. A second tunnel insulating film 45 is conformally formed on an entire surface of the substrate 1. The second tunnel insulating film 45 may be formed by a deposition process and may be a silicon oxide film. The second tunnel insulating film 45 may be formed on the high voltage gate insulating film 41 of the peripheral circuit region (LVT, HVT).

Figure 17:
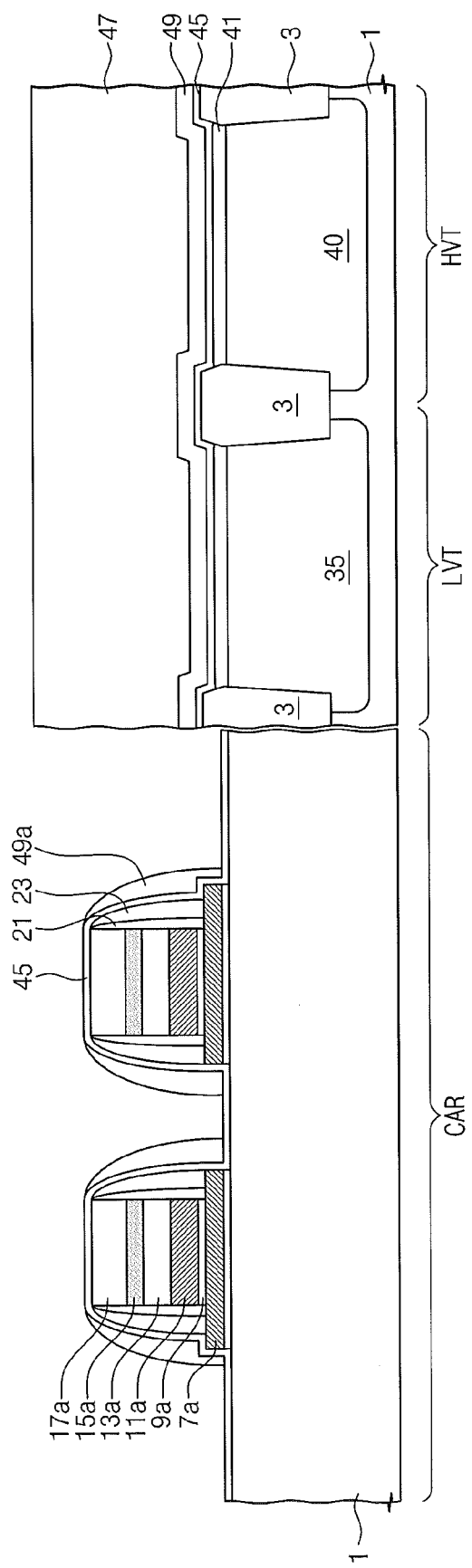

Referring to FIG. 17, a third sacrificial film 49 is formed on an entire surface of the substrate 1 including the second tunnel insulating film 45. The third sacrificial film 49 may be, for example, a silicon nitride film having an etching selectivity with respect to the second tunnel insulating film 45. A sixth photoresist pattern 47 is formed on the third sacrificial film 49. The sixth photoresist pattern 47 covers the peripheral circuit region (LVT, HVT) but exposes the cell array region CAR. An anisotropic etching process is performed on the third sacrificial film 49 using the sixth photoresist pattern 47 as an etching mask to form a third sacrificial spacer 49a covering a sidewall of the second tunnel insulating film 45 covering a sidewall of the second sidewall spacer 23.

Figure 18:
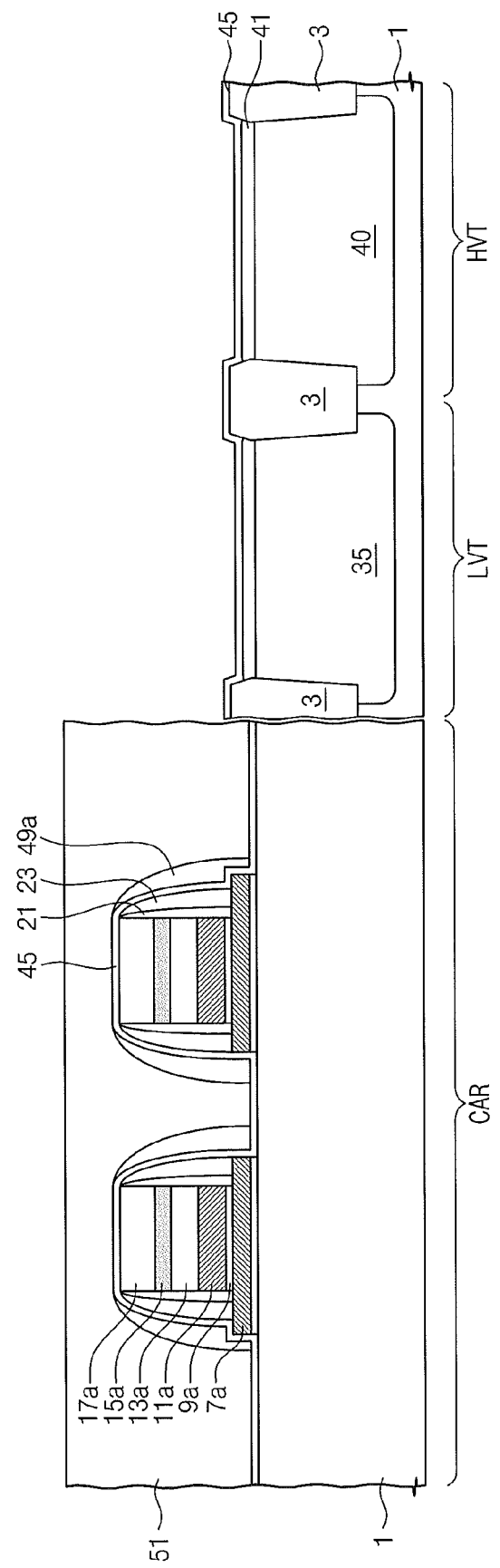

Referring to FIG. 18, the sixth photoresist pattern 47 is removed. A seventh photoresist pattern 51 covering the cell array region CAR but exposing the peripheral circuit region (LVT, HVT) is formed. The third sacrificial film 49 in the peripheral circuit region (LVT, HVT) is removed using the seventh photoresist pattern 51 as an etching mask.

Figure 19:
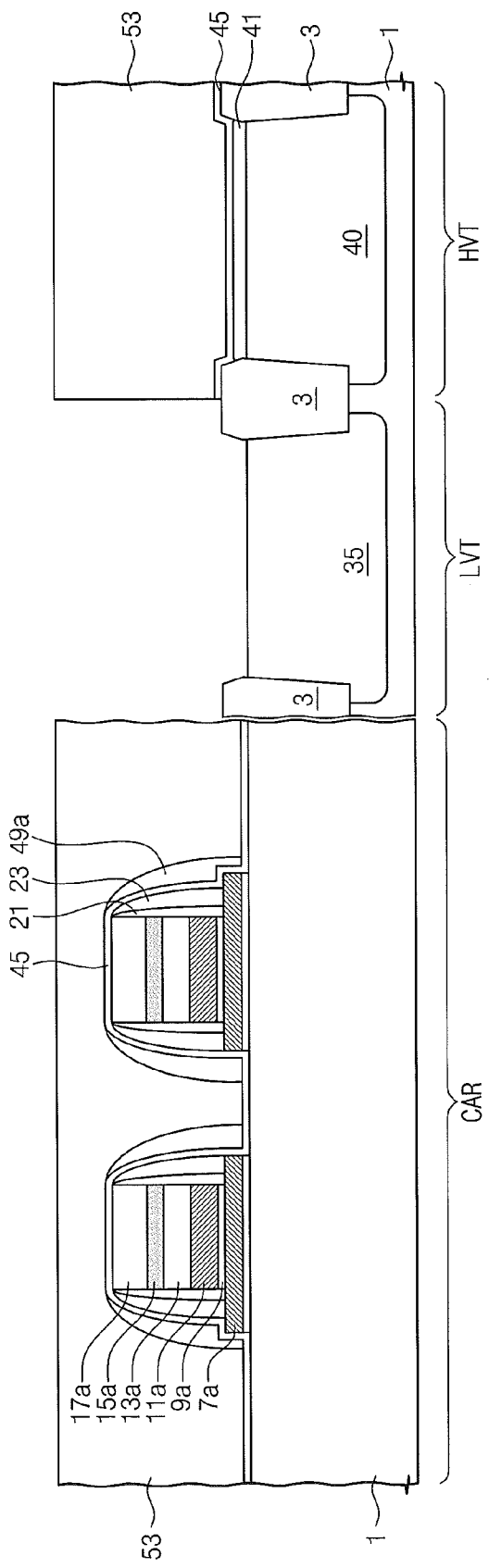

Referring to FIG. 19, the seventh photoresist pattern 51 is removed. A eighth photoresist pattern 53 covering the cell array region CAR and the high voltage transistor region HVT but exposing the low voltage transistor region LVT is formed. The second tunnel insulating film 45 and the high voltage gate insulating film 41 exposed in the low voltage transistor region LVT are removed using the eighth photoresist pattern 53 as an etching mask to expose a surface of the substrate 1. The eighth photoresist pattern 53 is removed along with the third sacrificial spacer 49a.

Figure 20:
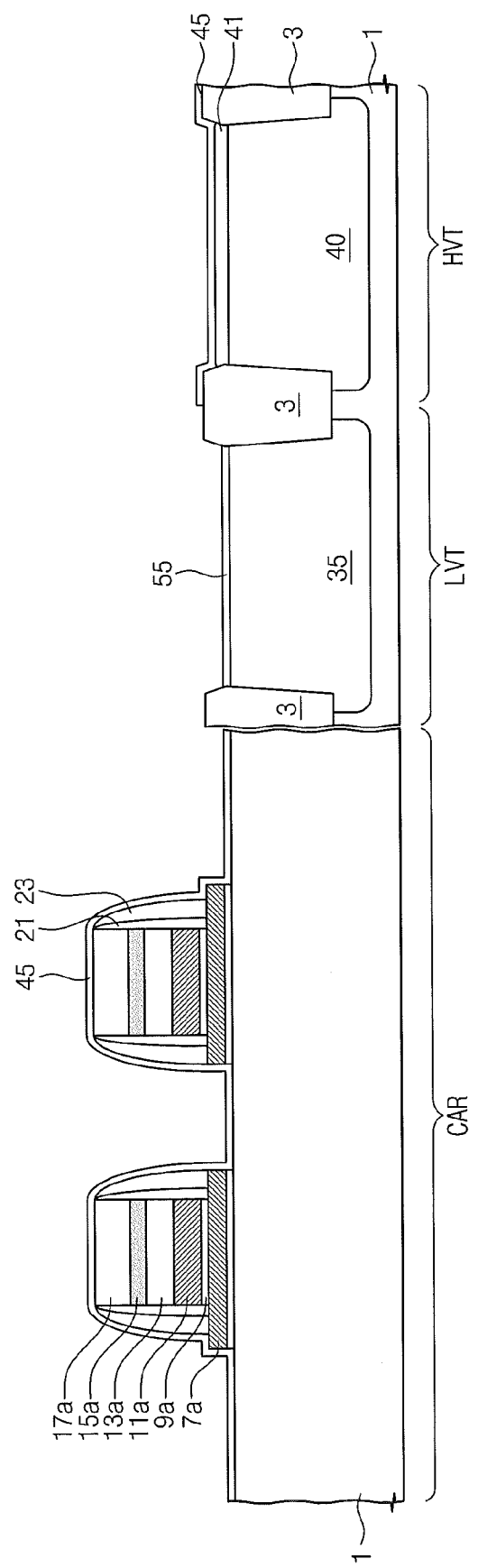

Referring to FIG. 20, a thermal oxidation process is performed on the exposed surface of the substrate 1 in the low voltage transistor region LVT to form a low voltage gate insulating film 55. After that, the eighth photoresist mask 53 is removed.

Figure 21:
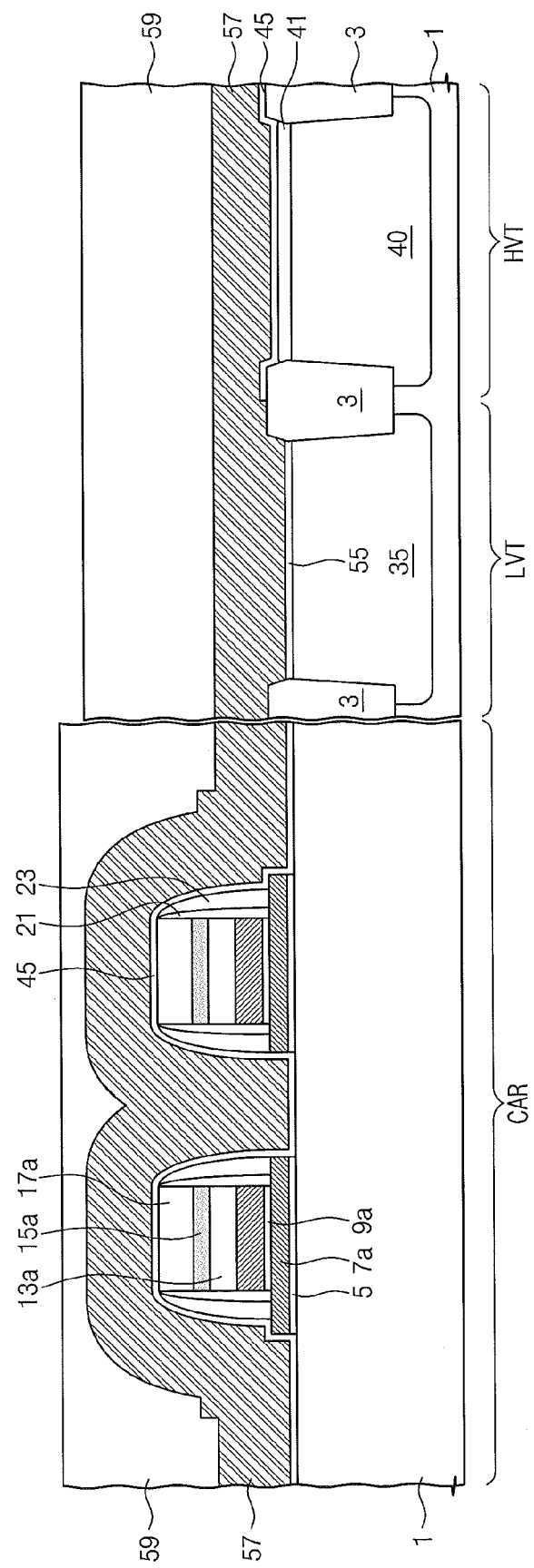

Referring to FIG. 21, a word line film 57 and a planarization auxiliary film 59 are sequentially formed on an entire surface of the substrate 1. The word line film 57 may be an undoped polysilicon film, that may be formed using a deposition process. The planarization auxiliary film 59 may be a film having a superior step coverage characteristic.

Figure 22:
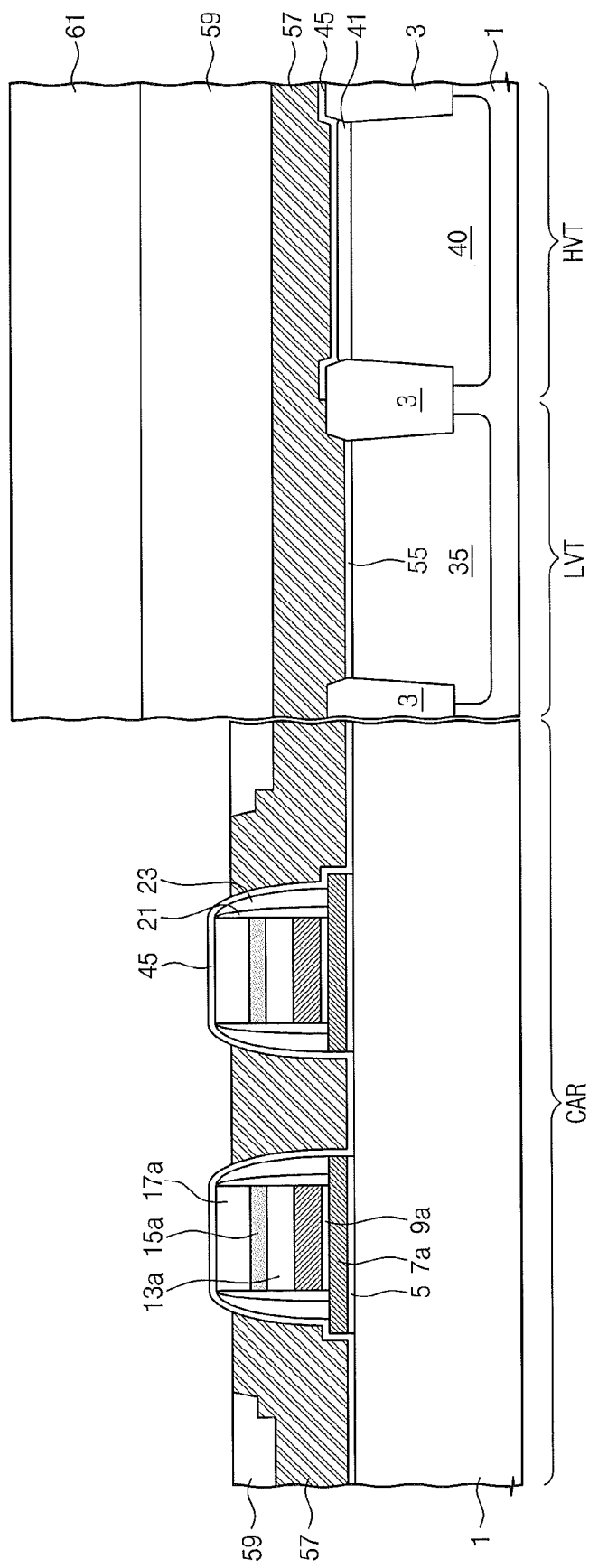

Referring to FIG. 22, a ninth photoresist pattern 61 covering the peripheral circuit region (LVT, HVT) but exposing the cell array region CAR is formed. In the cell array region CAR, a planarization etching process, for example, an etch-back process is performed on the planarization auxiliary film 59 and the word line film 57 using the ninth photoresist pattern 61 as an etching mask. The etch-back process may be performed until a part of upper portion of the third capping film 17a protrudes from a top surface of the word line film 57. A part of the planarization auxiliary film 59 may remain without being removed.

Figure 23:
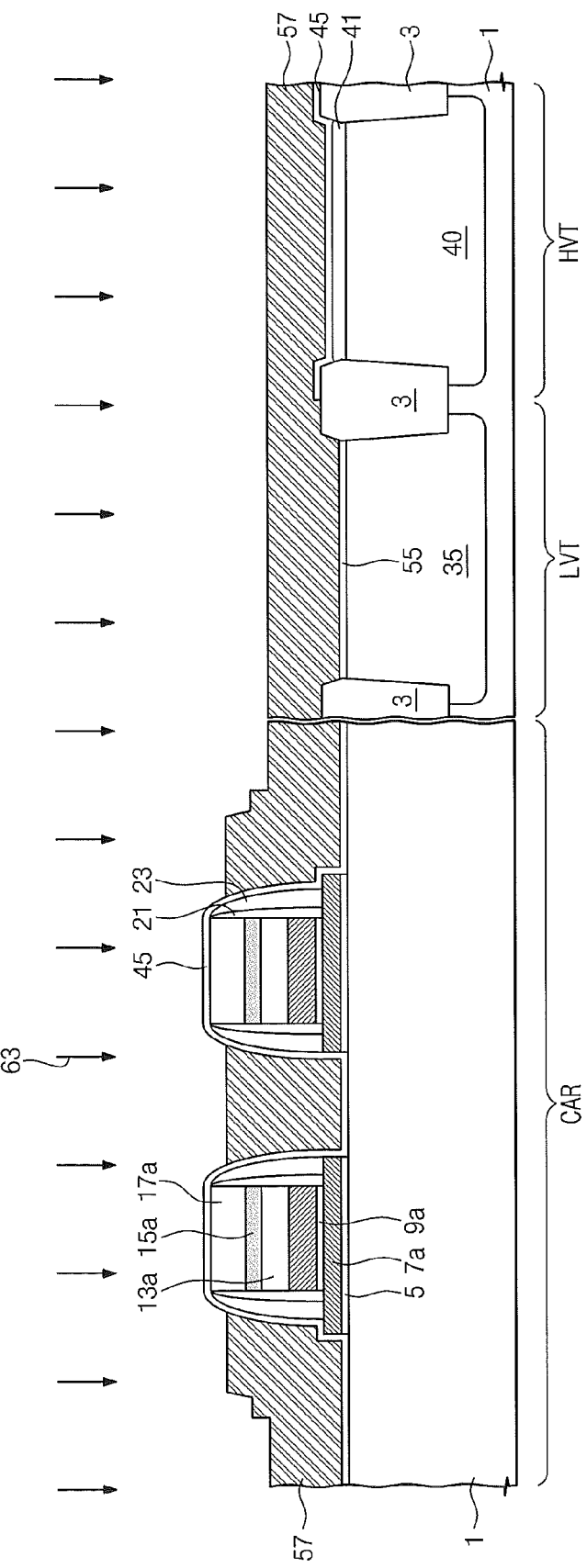

Referring to FIG. 23, the ninth photoresist pattern 61 and the remaining planarization auxiliary film 59 are removed to expose a top surface of the word line film 57. An ion implantation process 63 is performed on the exposed word line 57 to implant an impurity into the word line film 57.

Figure 24:
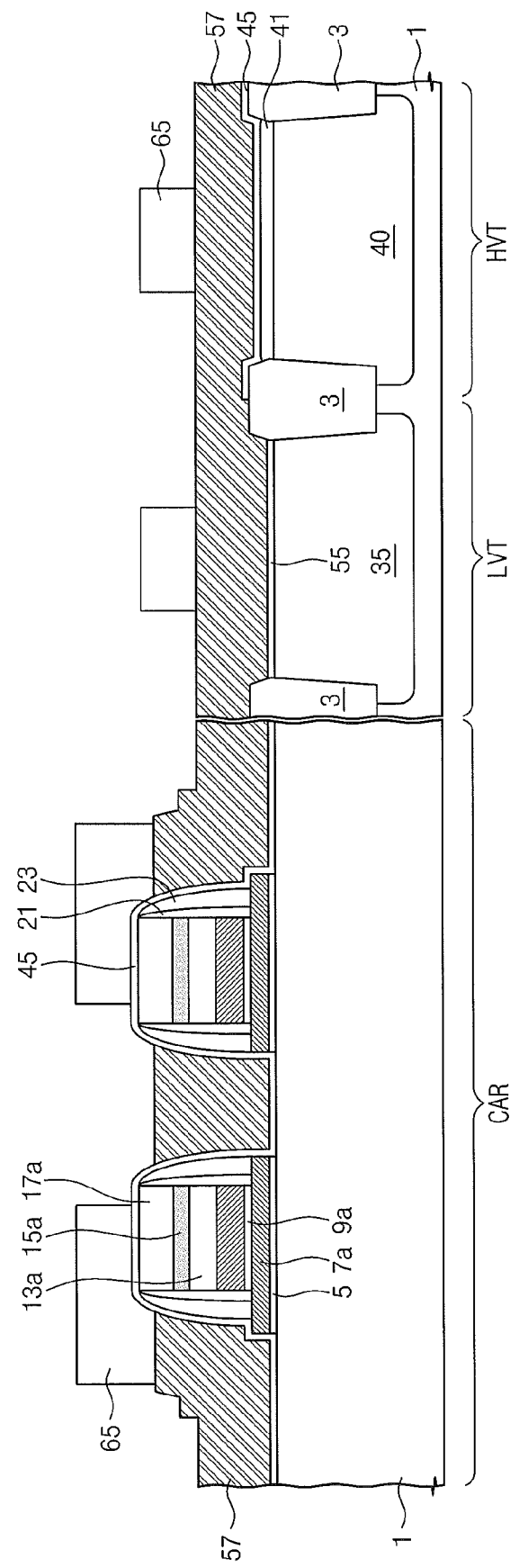
Figure 25:
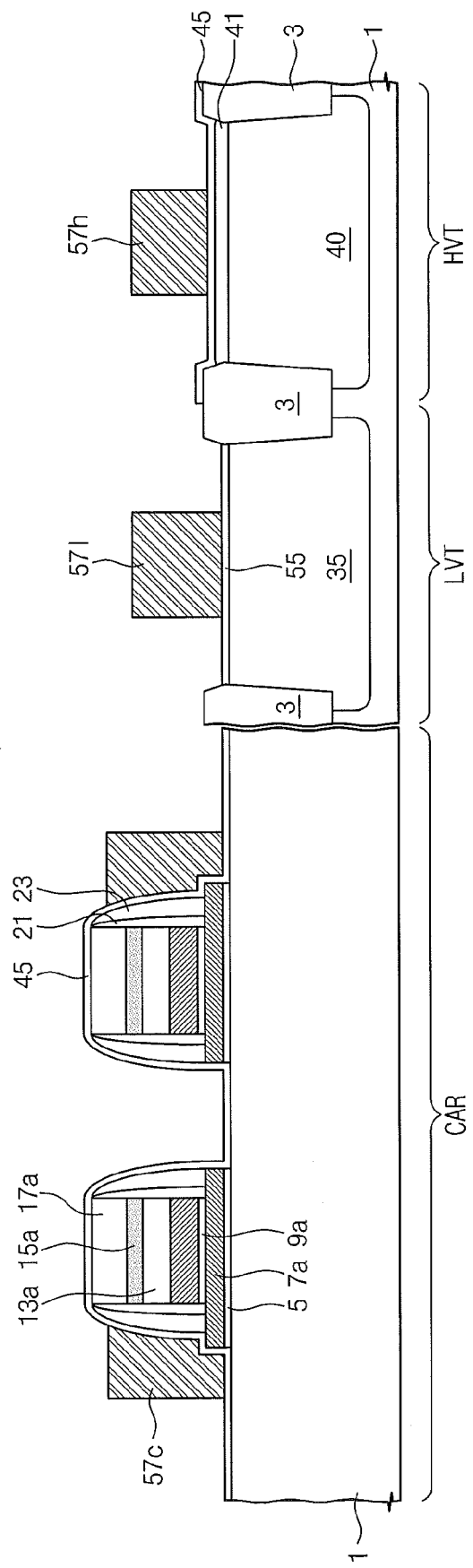

Referring to FIG. 24, tenth photoresist patterns 65 defining a word line and peripheral circuit gate electrodes respectively is formed on the word line film 57. The word line film 57 is etched using the tenth photoresist pattern 65 as an etching mask to form a word line 57c, a low voltage gate electrode 57l and a high voltage gate electrode 57h on the cell array region CAR, the low voltage transistor region LVT and the high voltage transistor region HVT respectively. After that, the tenth photoresist pattern 65 is removed.

Figure 26:
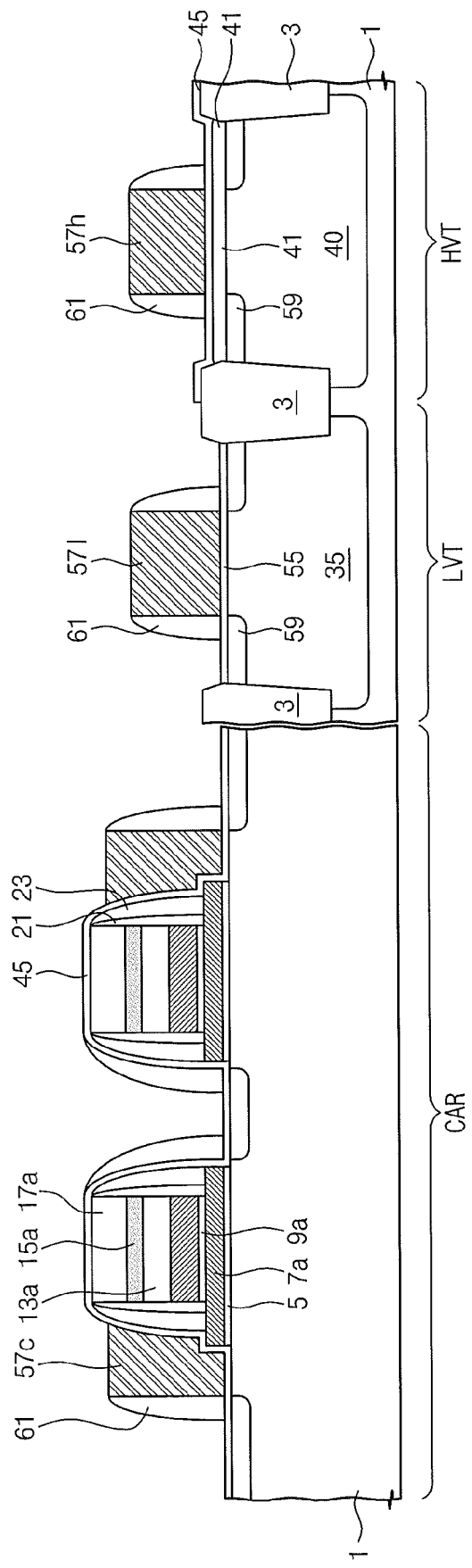

Referring to FIG. 26, a low voltage impurity region 59 is formed in the substrate 1 using the word line 57c, the third capping film pattern 17a, the second sidewall spacer 23, the low voltage gate electrode 57l and the high voltage gate voltage 57h as an ion implantation mask. A third sidewall spacer 61 covering the word line 57c, the second sidewall spacer 23, the low voltage gate electrode 57l and the high voltage gate electrode 57h is formed.

Figure 27:
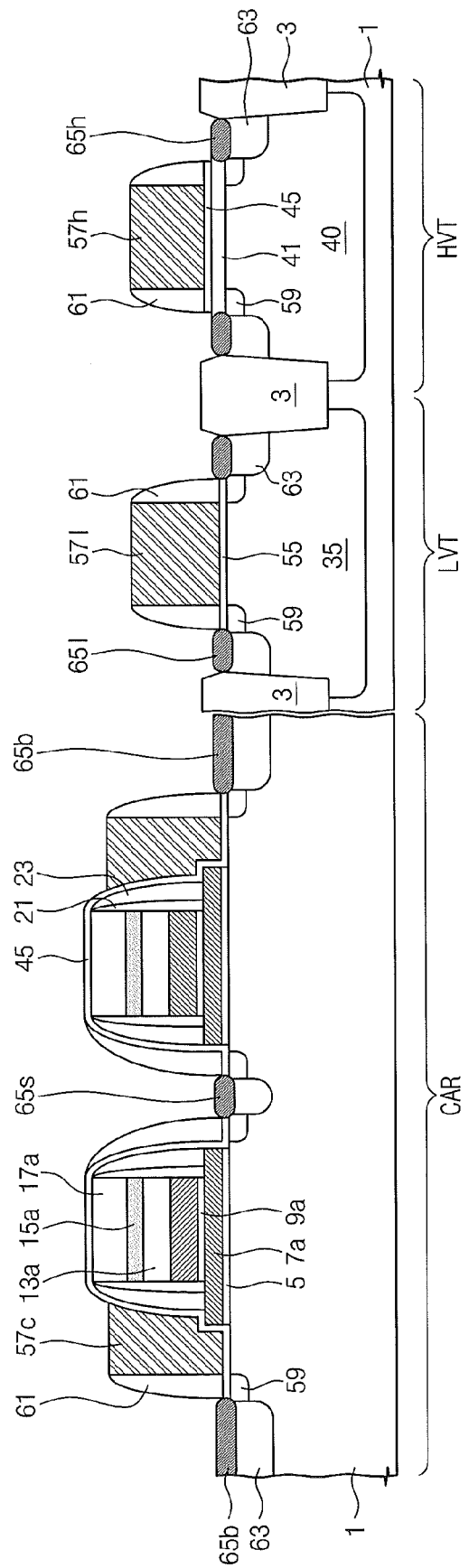

Referring to FIG. 27, a high voltage impurity region 63 is formed in the substrate 1 using the word line 57c, the third capping film pattern 17a, the low voltage gate electrode 57l, the high voltage gate electrode 57h and the third sidewall spacer 61 as an ion implantation mask. The first tunnel insulating film 5, the second tunnel insulating film 45, the low voltage gate insulating film 55 and the high voltage gate insulating film 41 that are on the high voltage impurity region 63 are removed to expose a surface of the substrate 1. After that, a metal silicide formation process is performed to form metal silicide films 65b, 65s, 65l and 65h on the exposed surface of the substrate 1.

Subsequently, the nonvolatile memory device of FIG. 4 is completed by forming an interlayer insulating film 67 and contact plugs 69 with reference to FIG. 4.

In a nonvolatile memory device in accordance with an embodiment of the inventive concept, since a distance between the word line and the floating gate is smaller than a distance between the word line and the memory gate, when a read operation is performed, a channel may be more easily formed under the floating gate. This is also advantageous to improvement of a breakdown voltage characteristic of the memory gate.

In a nonvolatile memory device in accordance with another embodiment of the inventive concept, one sidewall and a part of top surface of the floating gate adjacent to the word line form a corner and contact the second tunnel insulating film. When an erasure operation is performed, an electric field is concentrated on the corner and thereby charges may easily move from the floating gate toward the word line.

In a nonvolatile memory device in accordance with still another embodiment of the inventive concept, a bit line and a source line include metal silicide to reduce a resistance of the bit line and the source line, thereby improving a signal propagation velocity.

Since in a nonvolatile memory device of the inventive concept, an erasure operation is performed through the word line without including an erasure gate, complexity of design according to the formation of an erasure gate may be escaped and a manufacturing process may be simplified.

Also, since a nonvolatile memory device of the inventive concept includes a memory gate, when a program operation is performed, a source line voltage may be lowered. Since a negative voltage is applied to the memory gate when an erasure operation is performed, a thickness of oxide film under a word line may be lowered.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A nonvolatile memory device comprising:
   a floating gate on a substrate, with a first tunnel insulating film therebetween;
   a memory gate on the floating gate, with a blocking insulating film therebetween;
   a word line disposed at a first side of both the memory gate and the floating gate, with a second tunnel insulating film therebetween, wherein the first side of the floating gate protrudes beyond the first side of the memory gate toward the word line.

2. The nonvolatile memory device of claim 1 wherein a distance between the word line and the first side of the floating gate is less than a distance between the word line and the first side of the memory gate.

3. The nonvolatile memory device of claim 1, further comprising:
   a spacer between the first side of the memory gate and the second tunnel insulating film, wherein the first side of the floating gate further protrudes toward the word line past a sidewall of the spacer so that the first side and part of a top surface of the floating gate contacts the second tunnel insulating film.

4. The nonvolatile memory device of claim 3, wherein the spacer comprises a first spacer, the device further comprising:
   a second spacer, between the first spacer and the second tunnel insulating film on the first side of the memory gate, having an etching selectivity with respect to the first spacer.

5. The nonvolatile memory device of claim 1, wherein when an erasure operation is performed, charge stored by the floating gate moves toward the word line.

6. The nonvolatile memory device of claim 5, wherein when an erasure operation is performed, a negative voltage is applied to the memory gate.

7. The nonvolatile memory device of claim 1, further comprising:
   a bit line on the substrate separated from the first side of the memory gate and the floating gate by the word line; and
   a source line on the substrate at a second side of the memory gate and the floating gate opposite the first side and the word line,
   wherein the bit line and the source line comprise metal silicide.

8. The nonvolatile memory device of claim 1, wherein the second tunnel insulating film extends between the word line and the substrate.

9. The nonvolatile memory device of claim 1, further comprising:
   a high voltage transistor on the substrate in a peripheral circuit region including a high voltage gate electrode on the substrate,
   wherein the high voltage gate electrode and the word line comprise an identical material.

10. The nonvolatile memory device of claim 9, wherein the high voltage transistor further comprises:
    a first high voltage gate insulating film and a second high voltage gate insulating film between the high voltage gate electrode and the substrate, and
    wherein the second high voltage gate insulating film and the second tunnel insulating film comprise a second identical material.

11. The nonvolatile memory device of claim 1, further comprising:
    a low voltage transistor on the substrate in a peripheral circuit region and includes a low voltage gate electrode on the substrate, wherein the low voltage gate electrode and the word line comprise an identical material.

12. The nonvolatile memory device of claim 11, further comprising:
    a device isolation film on the substrate defining the peripheral circuit region, wherein a top surface of the device isolation film protrudes upwardly from a surface of the substrate and a height of top surface of the device isolation film from the surface of the substrate corresponds to the sum of a thickness of the first tunnel insulating film and a thickness of the floating gate.

13. A split-gate nonvolatile memory device comprising:
    a floating gate on a substrate separated by a first tunnel insulating film;
    a memory gate on the floating gate; and
    a word line disposed at a first side of both the memory gate and the floating gate, with a second tunnel insulating film therebetween, including a notch therein allowing the first side of the floating gate to be located closer to the word line than a closest portion of the first side of the memory gate.

14. The nonvolatile memory device of claim 13 wherein the word line and the memory gate are configured to receive voltages that are about equal to one another during a read operation to the split-gate nonvolatile memory device.

15. The nonvolatile memory device of claim 14 wherein the word line is configured to receive a first voltage and the memory gate is configured to receive a second voltage that is greater than the first voltage sufficient to cause tunneling of charge from the substrate to the floating gate during a program operation to the split-gate nonvolatile memory device.

16. The nonvolatile memory device of claim 15 further comprising:
a metal silicide source line on the substrate at a second side of both the memory gate and the floating gate, opposite the first side, wherein the metal silicide source line is configured to receive a third voltage that is greater than the first voltage and less than the second voltage during the program operation.

17. The nonvolatile memory device of claim 13 wherein the word line is configured to receive a first voltage and the memory gate is configured to receive a negative voltage that is sufficient to cause tunneling of charge from the floating gate to the word line through the second tunnel insulating film inside the notch during an erasure operation to the split-gate nonvolatile memory device.

18. The nonvolatile memory device of claim 13 wherein a dedicated erasure gate is absent from the split-gate nonvolatile memory device.

19. The nonvolatile memory device of claim 13 wherein a second side of the floating gate, opposite the first side, protrudes beyond a second side of the memory gate, opposite the first side so that the floating gate extends beyond both the first side and second sides of the memory gate.

20. The nonvolatile memory device of claim 13 wherein a distance from an outer surface of the second tunnel insulating film to an inner surface of the second tunnel insulating film comprises about 100~140Å.

* * * * *